US007013013B2

(12) United States Patent
Takei

(10) Patent No.: US 7,013,013 B2
(45) Date of Patent: Mar. 14, 2006

(54) SURROUND DEVICE

(75) Inventor: Yoshinori Takei, Saitama-ken (JP)

(73) Assignee: Pioneer Electronic Corporation, Tokyo (JP)

( * ) Notice: Subject to any disclaimer, the term of this patent is extended or adjusted under 35 U.S.C. 154(b) by 100 days.

(21) Appl. No.: 10/626,616

(22) Filed: Jul. 25, 2003

(65) Prior Publication Data

US 2004/0120537 A1 Jun. 24, 2004

Related U.S. Application Data

(62) Division of application No. 09/271,382, filed on Mar. 18, 1999, now abandoned.

(30) Foreign Application Priority Data

Mar. 20, 1998 (JP) ................................ 10-072902
Mar. 20, 1998 (JP) ................................ 10-072903

(51) Int. Cl.
*H04R 5/02* (2006.01)
*H04R 29/00* (2006.01)
*H04R 5/00* (2006.01)
*H03G 3/00* (2006.01)

(52) U.S. Cl. .......................... 381/307; 381/56; 381/22; 381/98; 381/61

(58) Field of Classification Search .................. 381/61, 381/58, 307, 56–57, 26–27
See application file for complete search history.

(56) References Cited

U.S. PATENT DOCUMENTS 4,024,344 A 5/1977 Dolby et al. .................. 179/1
4,622,689 A * 11/1986 Hobrough .................. 381/303
5,172,358 A * 12/1992 Kimura .................. 369/47.26
5,189,703 A * 2/1993 Holman ...................... 381/61
5,197,100 A 3/1993 Shiraki ...................... 381/27
5,298,674 A * 3/1994 Yun ............................ 84/616
5,673,327 A 9/1997 Julstrom .................... 381/119
5,764,777 A * 6/1998 Goldfarb .................... 381/27
5,850,453 A * 12/1998 Klayman et al. ............. 381/1

* cited by examiner

*Primary Examiner*—Laura A. Grier
(74) *Attorney, Agent, or Firm*—Arent Fox PLLC

(57) ABSTRACT

There is provided a surround device which processes stereo signals decoded by a decoder of a multi-channel surround method comprises boost means which boosts middle and low frequency components of a center channel signal in the stereo signals. There is also provided a surround device which processes stereo signals decoded by a decoder of a Dolby Pro Logic method comprises boost means which boosts high frequency components of a surround channel signal in the stereo signals. The boost means is composed of a level detector for detecting an output level of the channel signal, an operation portion for calculating and determining an amount of boost based on a result of the level detector, and a signal boost portion for boosting the channel signal based on a result of the operation portion.

2 Claims, 7 Drawing Sheets

SURROUND DEVICE

This is a Division of application Ser. No. 09/271,382 filed Mar. 18, 1999 now abandoned. The disclosure of the prior application is hereby incorporated by reference herein in its entirety.

BACKGROUND OF THE INVENTION

The present invention generally relates to a surround device which realizes a three-dimensional sound field by connecting a plurality of speakers, and more particularly, to a surround device provided with boost means for boosting particular frequency components of particular channel signals.

As is conventional, the Dolby Stereo method has been adopted as a two-track sound format such as movies. The Dolby Stereo method uses audio signals put together in two input channels to separate and reproduce signals into four output channel audio signals (left L, center C, right R, and surround S).

For example, an encoder adopting the Dolby Pro Logic method which is known as the two-track sound format described above will be explained with reference to FIG. 1. In the figure, four separate signals (left L, center C, right R, and surround S) are input into the encoder to create two final output signals of an L total (Lt) and R total (Rt). The outline of this signal processing will be explained as follows. After an audio input signal C as a center channel is level-attenuated by an attenuator by 3 dB, it is added to an audio input signal L for a left channel and an audio input signal R for a right channel, respectively. Further, an audio input signal S for a surround channel is added to these added signals after subjected to following four processes to create two final output signals of an L total (Lt) and R total (Rt):

a. the input signal S is attenuated by an attenuator by 3 dB;

b. further, frequency components from 100 Hz to 7 kHz are extracted with a BPF (band-pass filter);

c. in addition, elimination of noises is performed by a noise reduction circuit (Dolby NR encoder); and d. additionally, signals with phase differences of plus and minus 90 degrees are created.

Next, when the signals encoded by the signal processing with the Dolby Pro Logic method described above are reproduced as a three-dimensional sound field, the signal processing which is a contrary flow to that of the above mentioned encoder is performed. With this processing, the two input signals of Lt and Rt are separated into four channel signals of a front left channel (Lch), center channel (Cch), front right channel (Rch), and rear surround channel (Sch).

Incidentally, the reproduction for the rear surround channel is usually performed by monophonic using two speakers. In addition, the Dolby AC3 method or the like has been proposed as one of multi-channel surround systems other than the method described above.

Further, in these surround devices, a speech portion of a person such as an actor (especially in movies) is generally designed to be fixed in the center channel (Cch).

In the multi-channel surround devices adopting the Dolby Pro Logic and Dolby AC3 methods described above, the total sum level of all channel outputs other than the center channel becomes low rapidly when speech becomes principal. In such a case, it is consequential that the total sum level of all the sound volume of the channels including the center channel becomes also low abruptly. On the other hand, people's ears have been accustomed to the level before it was lowered, so that consequently it is hard to catch the speech from the center channel until people get used to a sound volume produced only by the center channel, and accordingly this point has been a problem.

In addition, particularly in the Dolby Pro Logic method, the frequency components from 100 Hz to 7 kHz of the audio input signal S for the surround channel, when encoded, has been bandlimited by a band-pass filter (BPF), and in particular, the signal level of the frequency components higher than 7 kHz is attenuated as the frequency thereof goes up.

Therefore, there was a problem that the presence as the three-dimensional sound field of the Dolby Pro Logic method is poorer in comparison to other surround systems, for example, the Dolby AC3 method.

SUMMARY OF THE INVENTION

The present invention has been made in an attempt to solve the above-described problems, and therefore, one of objects of the present invention is to provide a surround device which makes speech of a person easy to hear.

To attain the above object, the present invention provides a surround device for processing stereo signals decoded by a decoder adopting a multi-channel surround method, comprising boost means which boosts middle and low frequency components of a center channel signal in stereo signals.

With this configuration, in the case of person's speech, even when the total sum level of all channel signals lowers rapidly, the sound volume output from the center channel would not be turned down, so that an effect to make person's speech easy to hear may be obtained.

Thus, the present invention provides a surround device in which the boost means described above is composed of a level detection portion which detects an output level of the center channel signal, an operation portion which determines an amount of boost based on the result of the level detection portion, and a signal boost portion which boosts the center channel signal based on the result of the operation portion.

This enables the amount of boost to be set zero when input signals are large or small. Therefore, the boost means can be controlled so that when the input signals are large, an overscale is prevented, and when small, noise components are not boosted. Thus, even when the total sum level of all the channel signals lowers rapidly, the effect will be obtained in which person's speech from the center channel is made easy to hear.

The multi-channel surround method described above may be either the Dolby Pro Logic or Dolby AC3 method. If the present invention is applied to both above mentioned methods in which the center channel signal is attenuated, the effect is such that, even if the total sum level of all the channel signals is lowered abruptly, the sound volume output from the center channel would not be turned down, making it possible to hear speech of a person distinctly from front center side.

Furthermore, another object of the present invention is to provide a surround device which can reproduce presence by improving an output of the surround channel in a surround device adopting the Dolby Pro Logic method.

Thus, the present invention provides a surround device for processing stereo signals decoded by a decoder adopting the Dolby Pro Logic method, comprising boost means which boosts high frequency components in the surround channel signal in the stereo signals.

People's ears are sensitive to sounds with high frequency components, so that the sound volume in the high frequency components is increased by the boost means which boosts the high frequency components in the surround channel signal, in order to cause a sound source from the surround channel to be conscious, and obtain the effect of enhancing the presence as a three-dimensional sound field. In addition, the effect can be obtained so that a simple and cost effective surround device with the Dolby Pro Logic method can be made, which has increased presence as the three-dimensional sound field, and be equivalent to one adopting the Dolby AC3 method.

The present invention also provides a surround device in which the boost means described above is composed of a level detection portion which detects an output level of the surround channel signal, an operation portion which determines an amount of boost based on the result of the level detection portion, and a signal boost portion which boosts the surround channel signal based on the result of the operation portion.

This enables such an effect to be obtained that the amount of boost can be set zero when input signals are large or small. Therefore, the boost means can be controlled so that when the input signals are large, an overscale is prevented, and when small, noise components are not boosted. Thus, an effect can be obtained to create natural presence by increasing the sound volume of high frequency components only when it is required.

In the above configuration, the signal from the boost means of the surround channel signal may be divided into two channels. This enables the presence as the three-dimensional sound field to be better enhanced.

BRIEF DESCRIPTION OF THE DRAWINGS

The present invention, together with objects and advantages thereof, may best be understood by reference to the following description of the presently preferred embodiments together with the accompanying drawings in which.

DETAILED DESCRIPTION OF THE PREFERRED EMBODIMENTS

The preferred embodiments of the present invention will be described and they show a surround device which includes a decoder adopting the Dolby Pro Logic method.

Figure 1:
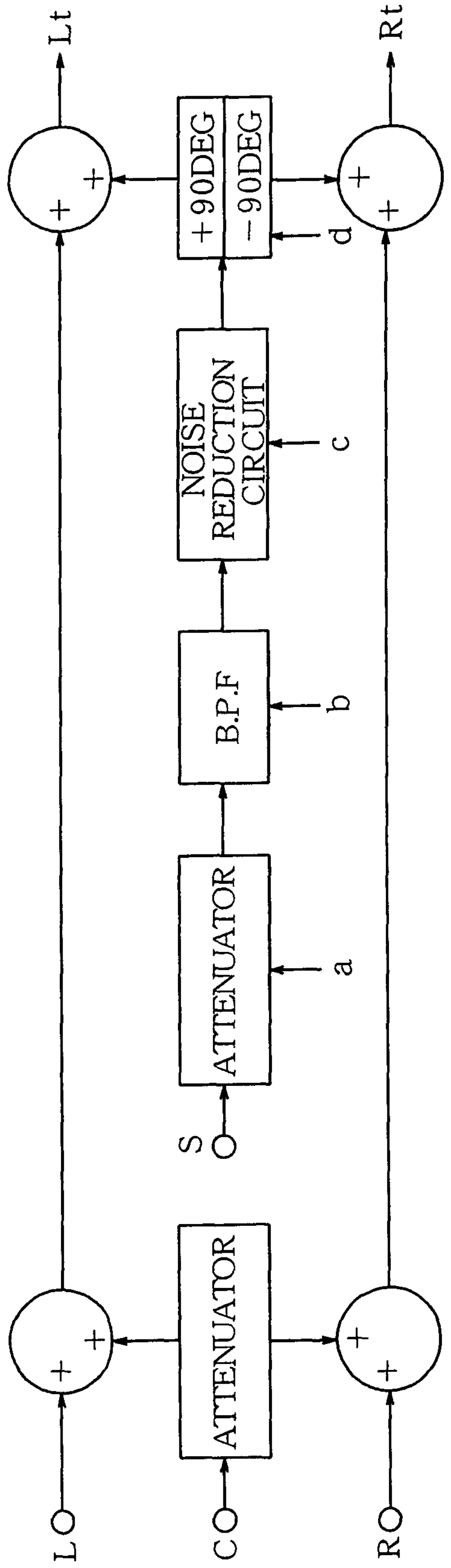
FIG. 1 is an illustration showing the concept of the Dolby Pro Logic method in a surround device of the prior art.
Figure 2:
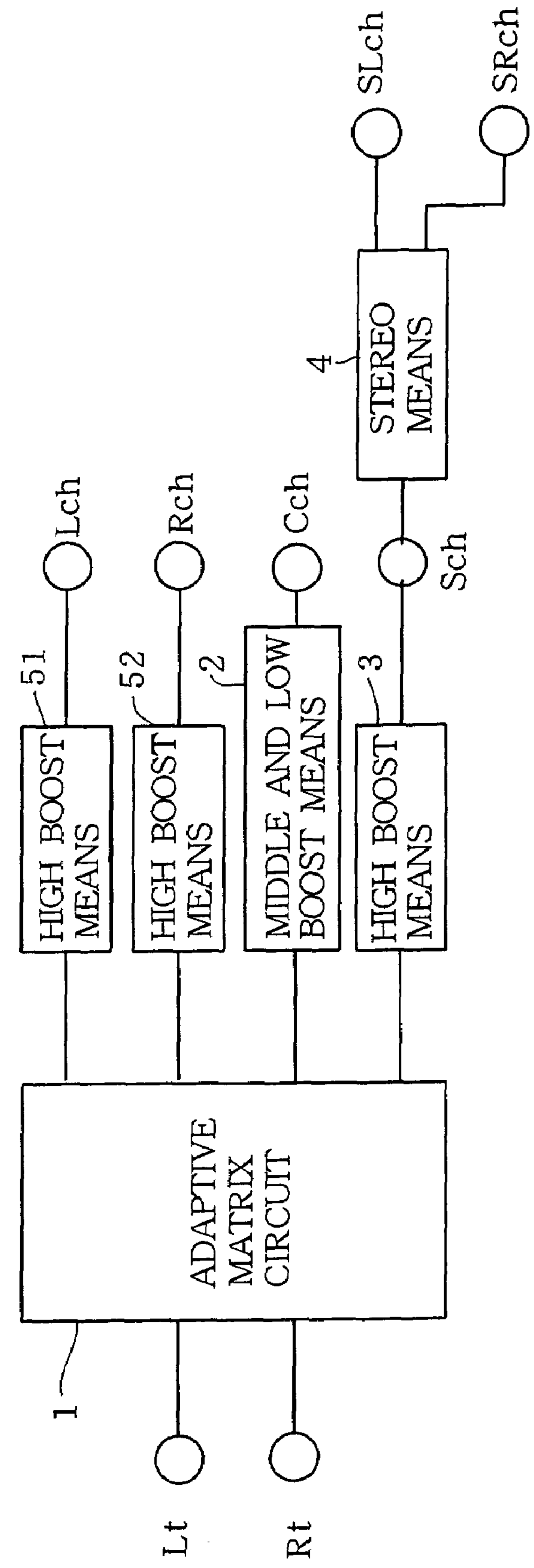
FIG. 2 is a block diagram of a decoder in an embodiment of a surround device according to the present invention.

As shown in FIG. 2, two source signals of an L total signal (Lt) and R total signal (Rt) are supplied to an adaptive matrix circuit 1 to be decoded into four channel signals of a front left channel (Lch) signal, center channel (Cch) signal, front right channel (Rch) signal, and rear surround channel (Sch) signal.

Figure 3:
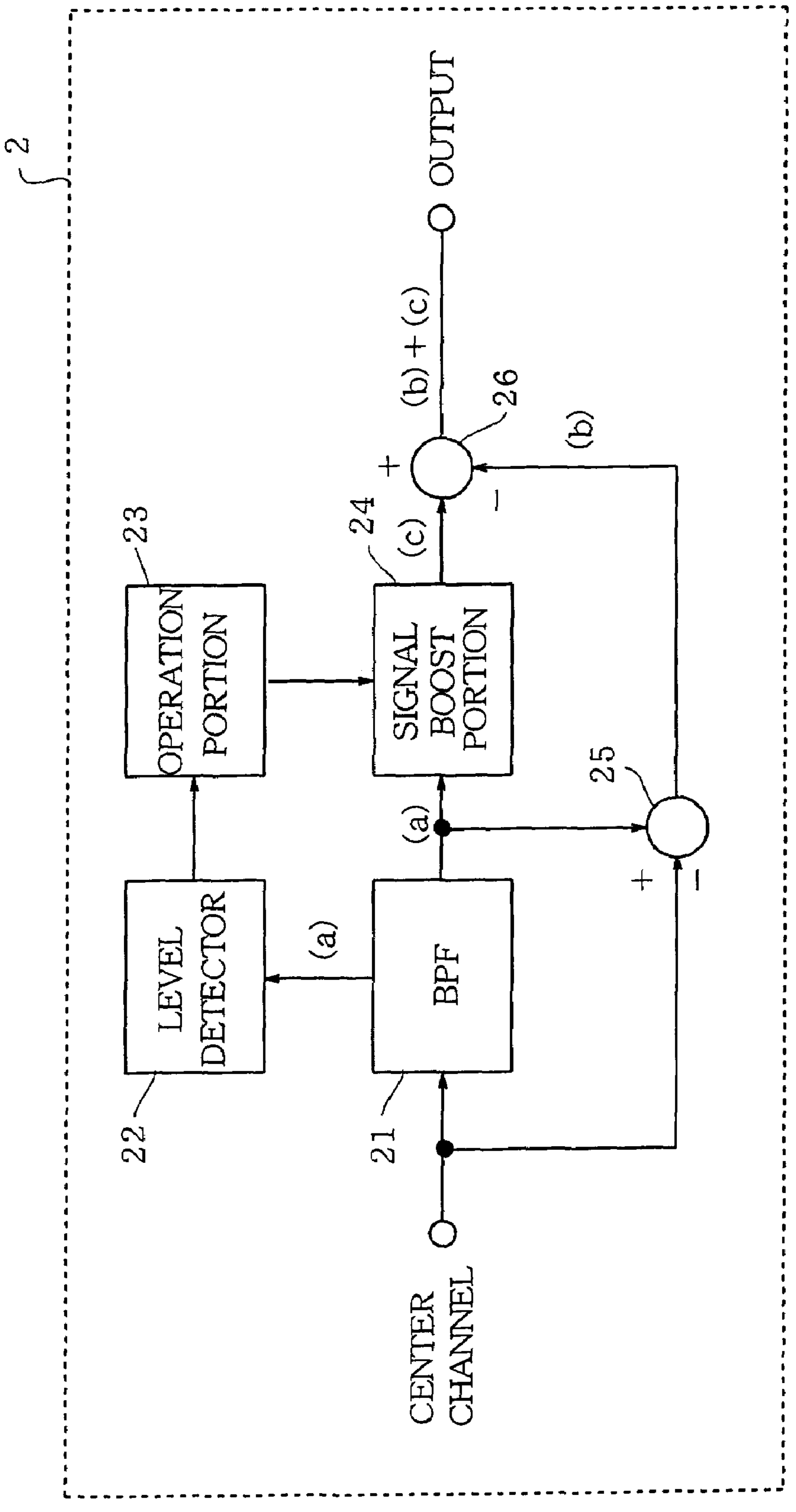
FIG. 3 is a signal flow diagram showing processing in middle and low boost means for the center channel signal in the decoder in the embodiment of the surround device according to the present invention.

Each of these decoded signals are output from the surround device through boost means which boost signal levels with respect to predetermined frequency range components of each signal. In particular, to solve the above mentioned problems, in the surround device according to the present invention the levels of middle and low frequency components of the center channel (Cch) signal decoded by the adaptive matrix circuit 1 are intensified by middle and low boost means 2 and then output. The detailed configuration of this middle and low boost means 2 will be described with reference to FIG. 3.

Initially, the center channel (Cch) signal decoded by the adaptive matrix circuit 1 is supplied to the middle and low boost means 2 which boosts the middle and low frequency component signals in the component signals of the center channel (Cch) signal. Then, it is subjected to the following processing performed by the middle and low boost means 2 to be output from the surround device as the signal of the center channel:

(1) The middle and low component signal (a) from 200 Hz to 5 kHz in the center channel (Cch) signal decoded by the adaptive matrix circuit 1 is firstly extracted by a band-pass filter (BPF) 21. Also, a signal (b) other than the middle and low component signal is extracted by an adder 25;

(2) A level detector 22 detects a signal level of the middle and low component signal (a) by performing a full-wave rectifying processing and integral processing to the middle and low component signal (a) to smooth the signal (a) (to process the signal (a) from AC to DC component);

(3) An operation portion 23 determines an amount of boost for the middle and low component signal (a) according to a level detection signal detected in the above step (2);

(4) A signal boost portion 24 boosts the middle and low component signal (a) from the band-pass filter (BPF) 21 according to the amount of boost which has been calculated and determined in the above step (3) and outputs a middle and low boost signal (c); and (5) An adder 26 adds the middle and low boost signal (c) boosted in the signal boost portion 24 and the signal (b) other than the middle and low component signal (a), extracted by the adder 25 in the above step (1) to output the added signal as a center channel signal from the surround device.

In this manner, the level of the middle and low frequency components of the center channel signal output from the surround device is more intensified in comparison with the center channel (Cch) signal decoded by the adaptive matrix circuit 1.

Next, the operation and determination of the amount of boost in the operation portion 23 and a boost configuration in the signal boost portion 24 in the above steps (3) and (4) will be described. Firstly, the amount of boost is concretely calculated and determined according to the following formula:

$$\text{Amount of boost } A=aX+b \tag{I}$$

wherein, a and b are constants which are selected by an input X and designated in Table 1. The amounts of boost A with respect to the inputs X are determined based on selection of the constants, as shown in Table 1.

Here, the middle and low component signal (a) is boosted by the signal boost portion 24 in the above step (4) based on the calculated and determined amount of boost. This boost operation is performed concretely according to the following formula (II):

$$\text{Output } Y = X + A \text{(dB)} \qquad \text{(II)}$$

The output Y, that is, the middle and low boost signal (c), with respect to the input X is determined based on this operation, as shown in Table 1.

Figure 4:
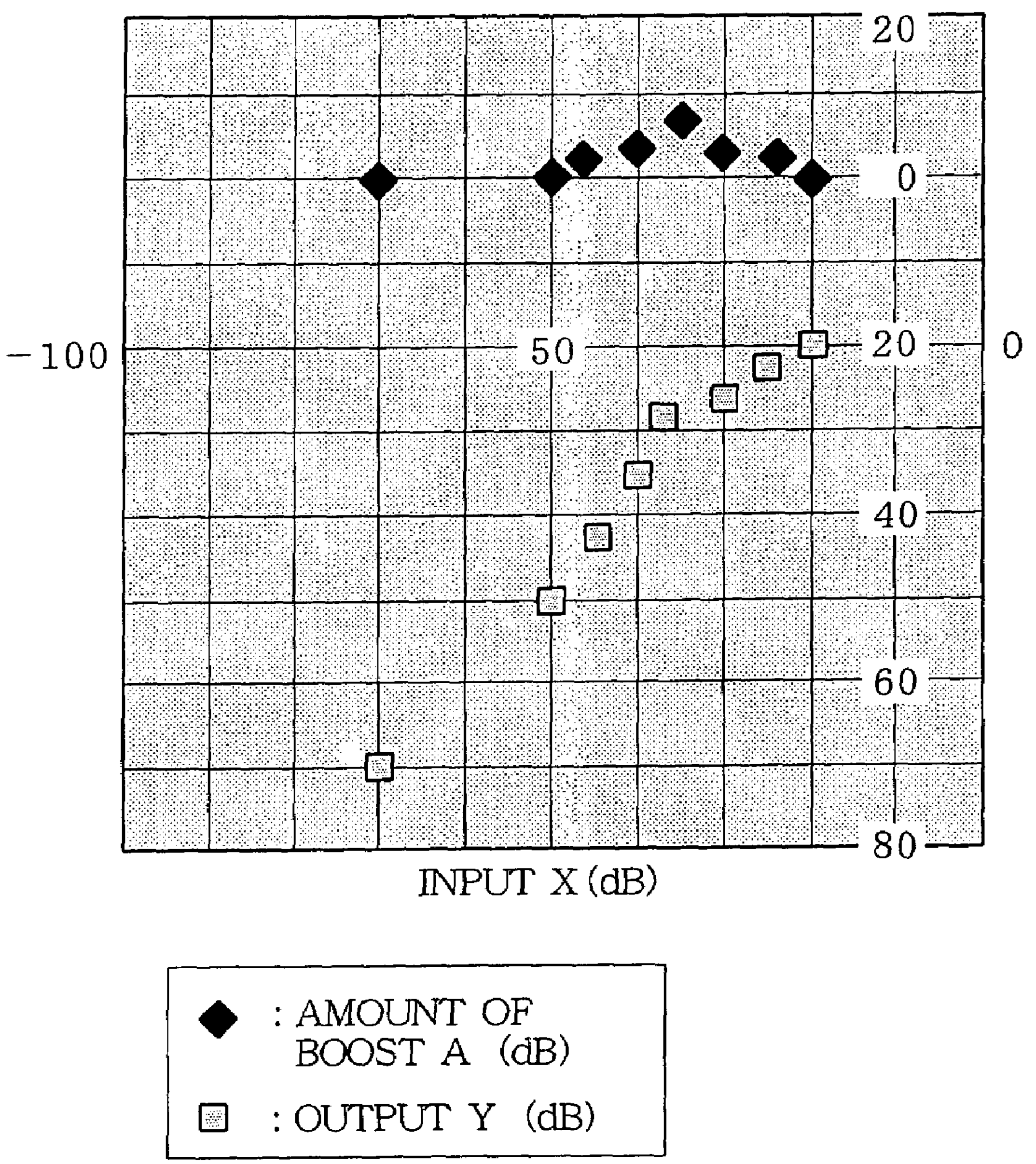
FIG. 4 is a graph showing relations of amounts of boost and outputs with respect to inputs in the decoder in the embodiment of the surround device related to FIG. 3.

Incidentally, Table 1 represents one example of the constants a and b, input X dB, amount of boost A dB, and output Y dB which are judged to be easy-to-hear condition based on an audition experimental result, and further, FIG. 4 depicts Table 1 in graph.

TABLE 1

| Input | Amount of Boost | Output | Constants for calculation of the amount of boost | |
|---|---|---|---|---|
| X (dB) | A (dB) | Y (dB) | a | b |
| 0 | 0 | 0 | a1 | b1 |
| −20 | 0 | −20 | | |
| −20 | 0 | −20 | a2 | b2 |
| −25 | 2 | −23 | | |
| −25 | 2 | −23 | a3 | b3 |
| −30 | 4 | −26 | | |
| −30 | 4 | −26 | a4 | b4 |
| −35 | 6 | −29 | | |
| −35 | 6 | −29 | a5 | b5 |
| −40 | 4 | −36 | | |
| −40 | 4 | −36 | a6 | b6 |
| −45 | 2 | −43 | | |
| −45 | 2 | −43 | a7 | b7 |
| −50 | 0 | −50 | | |
| −50 | 0 | −50 | a8 | b8 |
| −70 | 0 | −70 | | |

The amount of boost A=aX+b (wherein, a and b are constants which vary according to the input X)

$$\text{The output } Y = X + A \text{(dB)}$$

As shown in Table 1, the amount of boost A reaches the maximum when the input signal X is approximately −35 dB, and it is not boosted when the input signal X is in the range from 0 to −20 dB, or −50 dB or lower, so that even when the input X is in high level, the output Y would not exceed the full scale inside of DSP, and when in the low level in which only noise components reside, the boost operation is prevented to function. Therefore, even when the total sum level of all the channel signals is lowered abruptly, the sound volume output from the center channel would not be turned down, making it possible to hear speech of a person distinctly from front center side.

The embodiment described above is applied to surround devices including the Dolby Pro Logic method, however, it will be appreciated that the embodiment may be applied to any other multi-channel surround devices so long as they do not damage the characteristics of the present invention as well as to the Dolby AC3 method. Furthermore, in this embodiment the amount of boost A is set up so that it reaches the maximum when the input signal X is approximately −35 dB and it is not boosted when the input signal X is in the range from 0 to −20 dB or below −50 dB, however, other settings other than those in the embodiment described above may also be employed so long as they do not damage the characteristics of the present invention.

Next, a configuration which reproduces the presence with improved surround channel outputs in a surround device adopting the Dolby Pro Logic method will be explained.

As mentioned above, among the signals decoded in the configuration of the surround device with the Dolby Pro Logic method shown in FIG. 2, high frequency components of the rear surround channel (Sch) signal are intensified by the high boost means 3, and further processed to a left rear surround channel (SLch) signal and a right rear surround channel (SRch) signal by the stereo means 4 to be output from the surround device.

Figure 5:
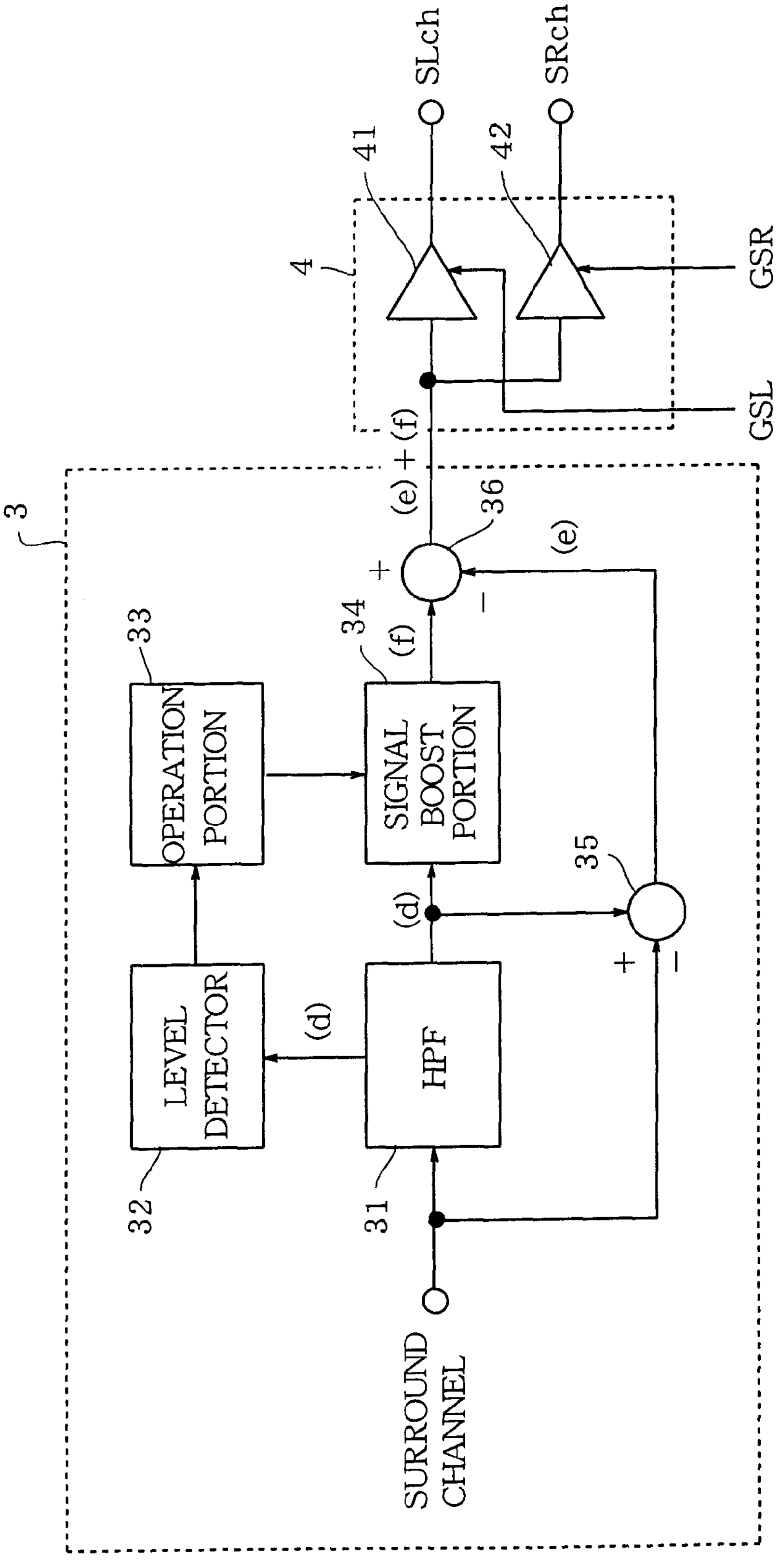
FIG. 5 is a signal flow diagram showing processing in high boost means for the surround channel signal and in stereo means in the decoder in the embodiment of the surround device according to the present invention.

Next, the detailed configuration of this high boost means 3 and stereo means 4 will be detailed with reference to FIG. 5.

The rear surround channel (Sch) signal which is decoded by the adaptive matrix circuit 1 is firstly supplied to the high boost means 3 which boosts high frequency component signal in the supplied component signal. This signal is then subjected to the following processing in the high boost means 3 and subsequently output as the rear surround channel signal to the next stage, i.e. the stereo means 4:

(1) The high component signal (d) 7 kHz or more of the rear surround channel (Sch) signal decoded by the adaptive matrix circuit 1 is extracted by a high-pass filter (HPF) 31. Also, a signal (e) other than the high component signal is extracted by an adder 35;

(2) A level detector 32 detects a signal level of the high component signal (d) by performing a full-wave rectifying processing and integral processing to the high component signal (d) to smooth the signal (d) (to process the signal (d) from AC to DC component);

(3) An operation portion 33 determines an amount of boost for the high component signal (d) according to a level detection signal detected in the above step (2);

(4) A signal boost portion 34 boosts the high component signal (d) from the high-pass filter (HPF) 31 according to the amount of boost which has been calculated and determined in the above step (3) and outputs a high boost signal (f); and (5) An adder 36 adds the high boost signal (f) boosted in the signal boost portion 34 and the signal (e) other than the high component signal (d), extracted by the adder 35 in the above step (1) to output the added signal as a rear surround channel signal.

In this manner, the level of the high frequency components of the rear surround channel signal output from the high boost means 3 is more intensified in comparison with the rear surround channel (Sch) signal decoded by the adaptive matrix circuit 1.

The calculation and determination of the amount of boost in the amount of boost operation portion 33 and a boost configuration in the signal boost portion 34 in the above steps (3) and (4) will be set up in the same manner as that of the center channel signal. The amount of boost is concretely calculated and determined according to the formula (I) described above. However, in the case of the rear surround channel signal, the calculation and determination of the amount of boost will be performed based on the constants indicated in Table 2 below.

Next, as with the center channel signal, the high component signal (d) is boosted by the signal boost portion 34 in the above step (4) based on the calculated and determined amount of boost. And, this boost operation is also performed according to the above mentioned formula (II) as with the center channel signal.

The output Y with respect to the input X, that is, the high boost signal (f), is determined according to this operation.

Figure 6:
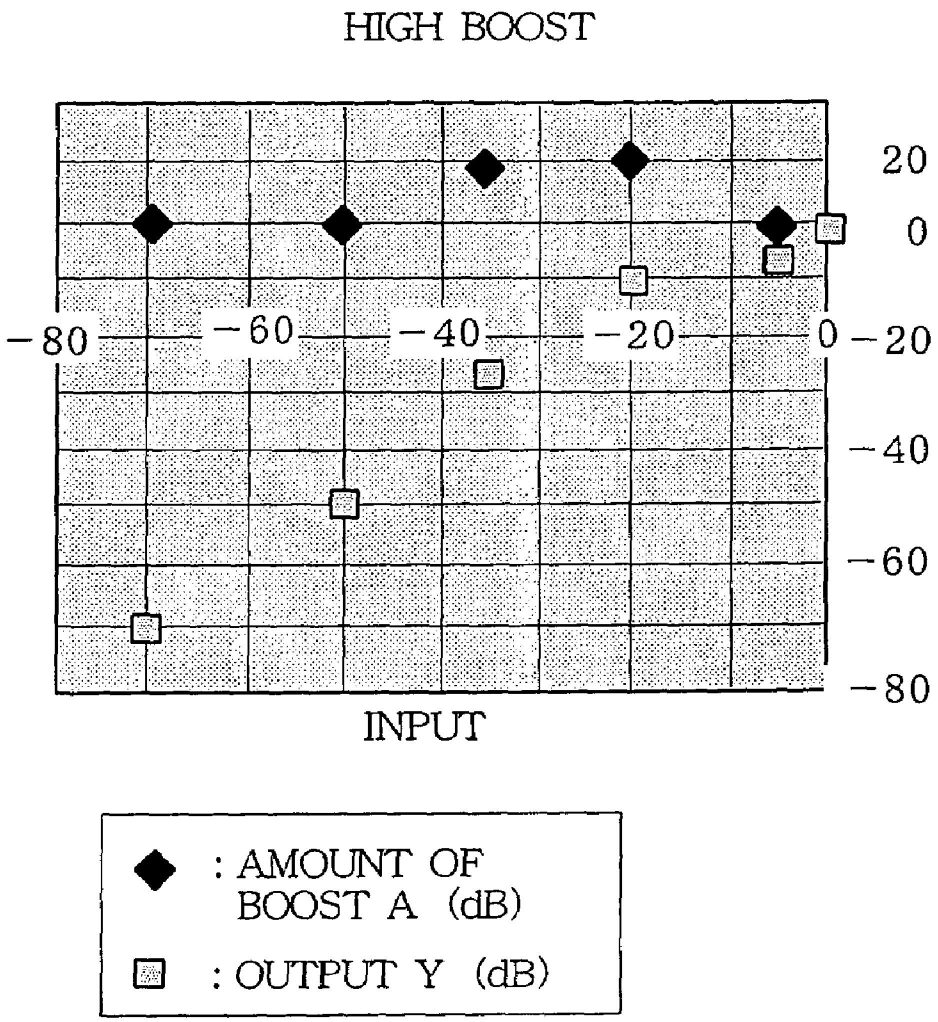
FIG. 6 is a graph showing relations of amounts of boost and outputs with respect to inputs in the decoder in the embodiment of the surround device related to FIG. 5.

Incidentally, Table 2 represents one example of the constants a and b, input X dB, amount of boost A dB, and output Y dB which are judged to be easy-to-hear condition based on an audition experimental result, and further, FIG. 6 depicts Table 2 in graph.

TABLE 2

| Input | Amount of Boost | Output | Constants for calculation of the amount of boost | |
|---|---|---|---|---|
| X (dB) | A (dB) | Y (dB) | a | b |
| 0 | 0 | 0 | a1 | b1 |
| −5 | 0 | −5 | | |
| −5 | 0 | −5 | a2 | b2 |
| −20 | 9 | −11 | | |
| −20 | 9 | −11 | a3 | b3 |
| −35 | 9 | −26 | | |
| −35 | 9 | −26 | a4 | b4 |
| −50 | 0 | −50 | | |
| −50 | 0 | −50 | a5 | b5 |
| −70 | 0 | −70 | | |

The amount of boost A=aX+b (wherein, a and b are constants which vary according to the input X)

The output $Y=X+A$(dB)

As shown in Table 2, the amount of boost A reaches the maximum when the input signal X is approximately −35 dB, and it is not boosted when the input signal X is in the range from 0 to −5 dB or below −50 dB, so that even when the input X is in high level, the output Y would not exceed the full scale inside of DSP, and when in the low level in which only noise components reside, the boost operation is prevented to function.

As previously explained in detail, people's ears are sensitive to sounds with high frequency components, so that the sound volume in the high frequency components is increased by the high boost means 3 which boosts the high frequency components in the surround channel signal and a sound source from the surround channel is caused to be conscious, thereby causing the presence as a three-dimensional sound field to be enhanced.

Incidentally, in this embodiment the amount of boost A is set up so that it reaches the maximum when the input signal X is approximately −35 dB and it is not boosted when the input signal X is in the range from 0 to −5 dB or below −50 dB, however, it will be appreciated that other settings other than those in the embodiment described above may also be employed so long as they do not damage the characteristics of the present invention.

In this manner, the level of the high frequency components of the rear surround channel signal is intensified and output from the high boost means 3, and then the rear surround channel signal is processed by the stereo means 4 into a left rear surround channel (SLch) signal and right rear surround channel (SRch) signal to be output from the surround device. This stereo means 4 is concretely configured so that, after the rear surround channel signal is distributed into two systems, level differences are added to the resulted respective distributed signals by signals GSL and GSR which reflect level difference between the front left channel (Lch) signal and front right channel (Rch) signal at amplifiers 41 and 42 and subsequently the respective distributed signals are output from the surround device as the left rear surround channel (SLch) signal and right rear surround channel (SRch) signal. That is, when the Lch is higher than the Rch by 1 dB in front signals, the surround left channel (SLch) signal is output directly without amplifying and the surround right channel (SRch) signal lower by 1 dB is output.

This causes the surround device to be closer to a surround system adopting the Dolby AC3 method or the like and allows the presence as a three-dimensional sound field to be increased.

Figure 7:
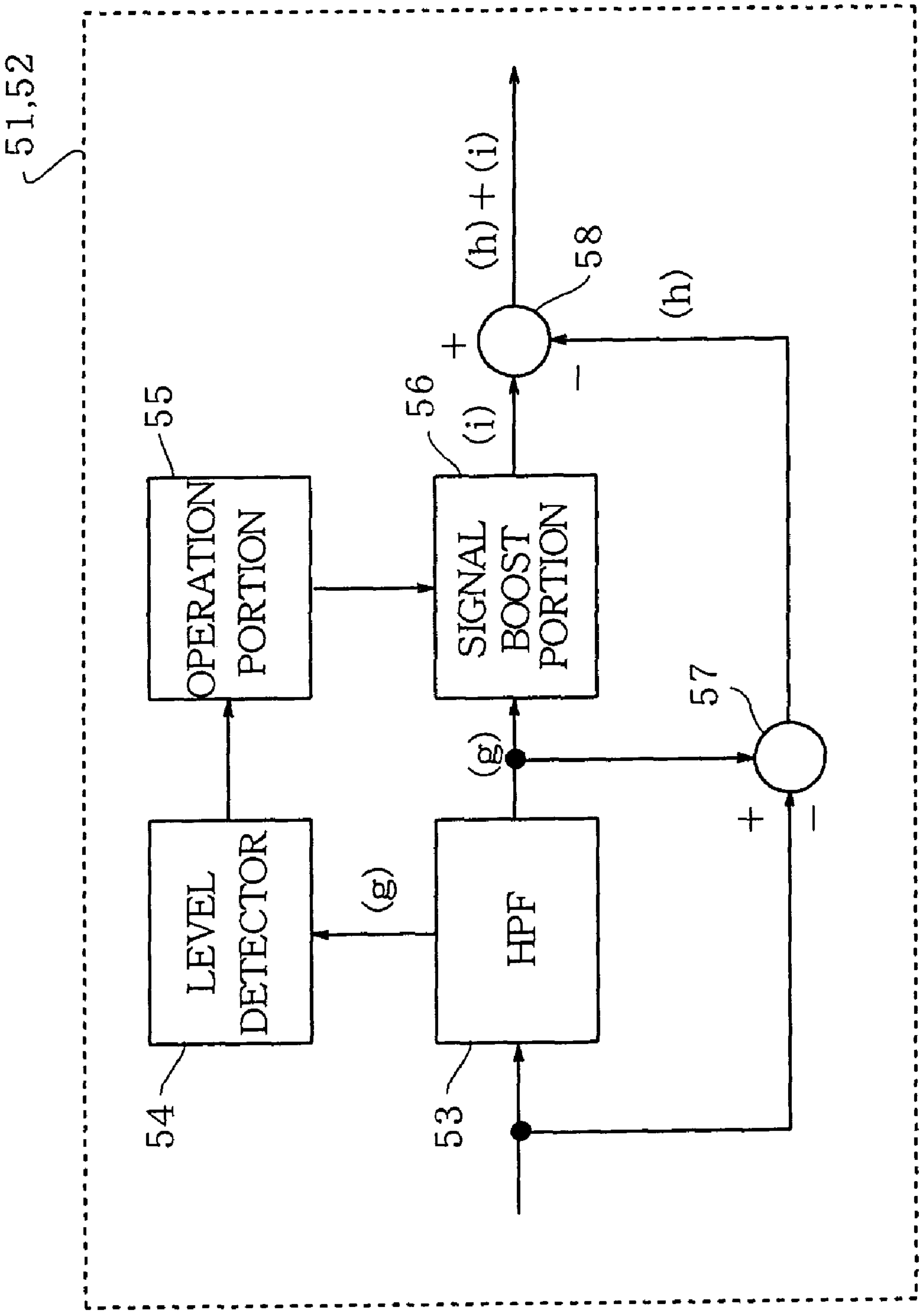
FIG. 7 is a signal flow diagram showing processing in high boost means for front right and left channel signals in the decoder according to the embodiment.

The surround device shown as one embodiment of the present invention causes the middle and low frequency components of the center channel (Cch) signal or the high frequency components of the rear surround channel (Sch) signal decoded by the adaptive matrix circuit 1 described above to be boosted. Furthermore, as shown in FIG. 2, the boost means 51 and 52 may also be provided which boost the respective signal levels of the high frequency components of the front left channel (Lch) signal and front right channel (Rch) signal. The configuration of the boost means 51 and 52 will be described using FIG. 7.

The front left channel (Lch) signal and front right channel (Rch) signal decoded by the adaptive matrix circuit 1 are firstly supplied to the high boost means 51 and 52 which boost the high predetermined frequency components in the supplied signal components, and subsequently, subjected to the same processing as that of in the high boost means 3 in these high boost means 51 and 52 to be output from the surround device as the front left channel signal and front right channel signal, respectively.

That is, the high frequency components (g) of the Lch and Rch signals decoded by the adaptive matrix circuit 1 are extracted by a high-pass filter (HPF) 53, and an adder 57 extracts signal (h) other than the high frequency components thereof.

Then, a level detector 54 detects a signal level of the high frequency component signal (g). An operation portion 55 determines an amount of boost of the high component signal (g) according to a detected level detection signal.

The high component signal (g) is boosted in a signal boost portion 56 according to the determined amount of boost to be output as a high frequency boost signal (i). The thus obtained high frequency boost signal (i) and the signal (h) other than the high frequency components are added and then output as the front left channel and front right channel signals from the surround device.

In this manner, each of the front left channel and front right channel signals output from the surround device is more enhanced in the level of its high frequency components than that of the front left channel (Lch) and front right channel (Rch) signals decoded by the adaptive matrix circuit 1.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. A surround device for processing multi-channel signals including a surround channel signal decoded by a decoder, the surround device comprising:

a boost device which boosts high frequency components of said surround channel signal wherein said boost device comprises a level detector for detecting an output level of said surround channel signal, an operation portion for calculating and determining an amount of boost based on a result of said level detector, and a signal boost portion for boosting said surround channel signal based on a result of said operation portion.

2. The surround device according to claim 1, further comprising a stereo device which divides an output of said boost device into two channel signals.

* * * * *